(12) United States Patent
Hsu et al.

(10) Patent No.: US 8,513,699 B2
(45) Date of Patent: Aug. 20, 2013

(54) LIGHT-EMITTING DEVICE

(75) Inventors: Chia-Liang Hsu, Hsinchu (TW);
Chih-Chiang Lu, Hsinchu (TW);
Chien-Fu Huang, Hsinchu (TW);
Chun-Yi Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 42 days.

(21) Appl. No.: 13/174,183

(22) Filed: Jun. 30, 2011

(65) Prior Publication Data

US 2011/0254046 A1    Oct. 20, 2011

Related U.S. Application Data

(63) Continuation of application No. 12/318,552, filed on Dec. 31, 2008, now Pat. No. 7,973,331.

(30) Foreign Application Priority Data

Jan. 8, 2008 (TW) ................................ 97100674 A

(51) Int. Cl.
*H01L 33/62* (2010.01)
(52) U.S. Cl.
USPC .................................... 257/99; 257/E33.066
(58) Field of Classification Search
USPC ............... 257/98, 99, 79, 88, 103, E27.121, 257/E33.066, E33.013
See application file for complete search history.

(56) References Cited

U.S. PATENT DOCUMENTS

| | | | |
|---|---|---|---|
| 2003/0010986 A1 | 1/2003 | Lin et al. | |
| 2006/0011935 A1* | 1/2006 | Krames et al. | 257/99 |
| 2006/0124941 A1 | 6/2006 | Lee et al. | |
| 2008/0251796 A1 | 10/2008 | Lee et al. | |
| 2008/0251808 A1* | 10/2008 | Kususe et al. | 257/98 |

FOREIGN PATENT DOCUMENTS

CN   2434788   6/2001

* cited by examiner

*Primary Examiner* — Victor A Mandala
*Assistant Examiner* — Whitney T Moore
(74) *Attorney, Agent, or Firm* — Ditthavong Mori & Steiner, P.C.

(57) ABSTRACT

The present invention is related to a light-emitting device. The present invention illustrates a vertical light-emitting device in one embodiment, comprising the following elements: a conductive substrate includes a through-hole, a patterned semiconductor structure disposed on a first surface of the substrate, a first bonding pad and a second bonding pad disposed on a second surface of the substrate, a conductive line passing through the through-hole connecting electrically the semiconductor structure layer, and an insulation layer on at least one sidewall of the through-hole insulates the conductive line form the substrate. The present invention illustrates a horizontal light-emitting device in another embodiment, comprising the following elements: a substrate includes a first tilted sidewall, a patterned semiconductor structure disposed on a first surface of the substrate, a first conductive line is disposed on at least the first tilted sidewall of the substrate and connecting electrically the patterned semiconductor structure.

18 Claims, 14 Drawing Sheets

LIGHT-EMITTING DEVICE

CROSS REFERENCE TO RELATED APPLICATIONS

This application is a continuation of U.S. application Ser. No. 12/318,552, filed Dec. 31, 2008, which claims the right of priority based on Taiwan Patent Application No. 097100674 entitled "Light-Emitting Device", filed on Jan. 8, 2008, which is incorporated herein by reference and assigned to the assignee herein.

TECHNICAL FIELD

The present invention generally relates to a light-emitting device, and more particularly to a light-emitting diode.

BACKGROUND

Light-emitting diodes (LEDs) having advantages of low electricity consumption and high-speed power on-off response are versatile for different applications. Following the high-end cellular phone adopting LEDs as the back-lighting source, more and more electronic products intent to use LEDs. Since the electronic products require light, thin, short, and small, how to reduce the LEDs package space and cost is a key issue.

LEDs with transparent substrate can be classified as a face up type and a flip chip type. The LEDs mentioned above may be mounted with the substrate side down onto a submount via a solder bump or glue material to form a light-emitting apparatus. Besides, the submount further comprises at least one circuit layout electrically connected to the electrode of the LEDs via an electrical conducting structure, such as a metal wire. Such LEDs package has difficulty to satisfy the light, thin, short, and small requirements because so many kinds of package materials stack together. In sum, a reduced package size of the LEDs and simpler package process are needed.

SUMMARY

A wafer level chip scale package (WLCSP) is provided to achieve the purpose of a smaller size of LEDs package and a simpler package process, and increase the LEDs light extraction efficiency in the same time.

In one embodiment of the present invention, a light-emitting device includes a conductive substrate with a through-hole, a patterned semiconductor structure which includes a first conductive type semiconductor layer, an active layer and a second conductive type semiconductor layer on a first surface of the substrate, a first bonding pad and a second bonding pad on a second surface of the substrate, a conductive line through the through-hole connecting electrically the first conductive type semiconductor with the first bonding pad, and an isolating layer on at least the sidewall of the through-hole isolates the conductive line from the substrate.

In another embodiment of the present invention, a light-emitting device includes a substrate with at least a tilted sidewall, a patterned semiconductor structure which includes a first conductive type semiconductor layer, an active layer and a second conductive type semiconductor layer on a first surface of the substrate, and a first conductive line on at least the tilted sidewall of the substrate connects electrically the first conductive type semiconductor layer of the patterned semiconductor structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
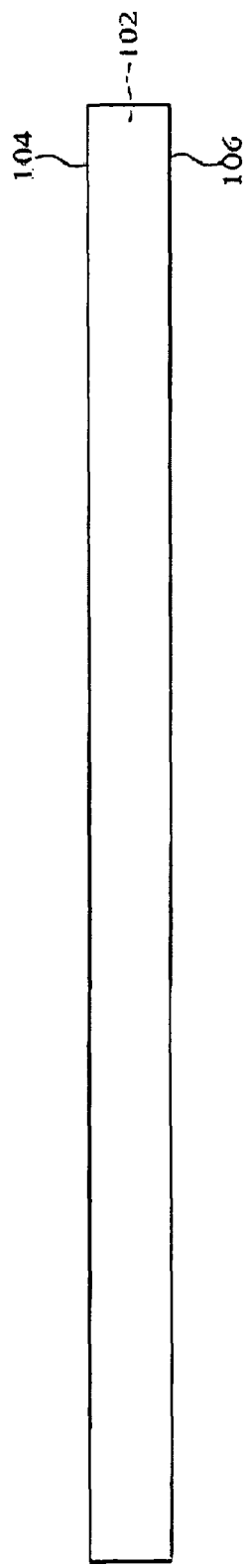
FIGS. 1A-1H illustrate a process flow of forming a light-emitting device in accordance with one embodiment of the present invention.
Figure 1B:
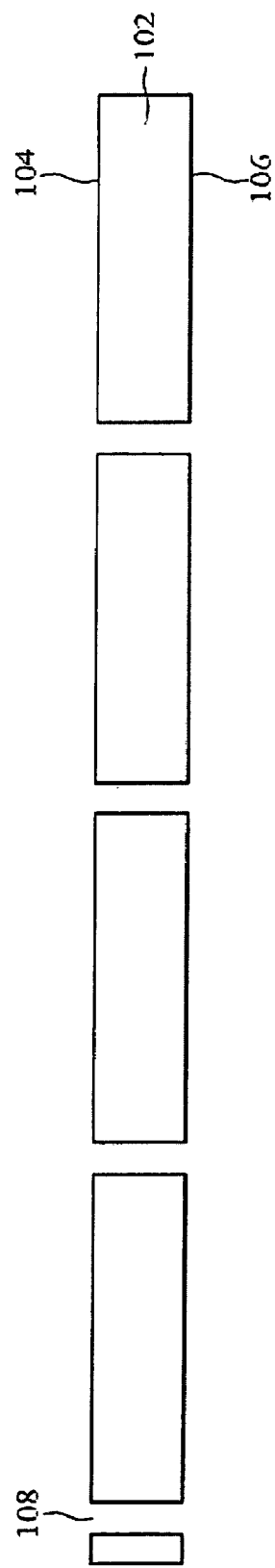
Figure 1C:
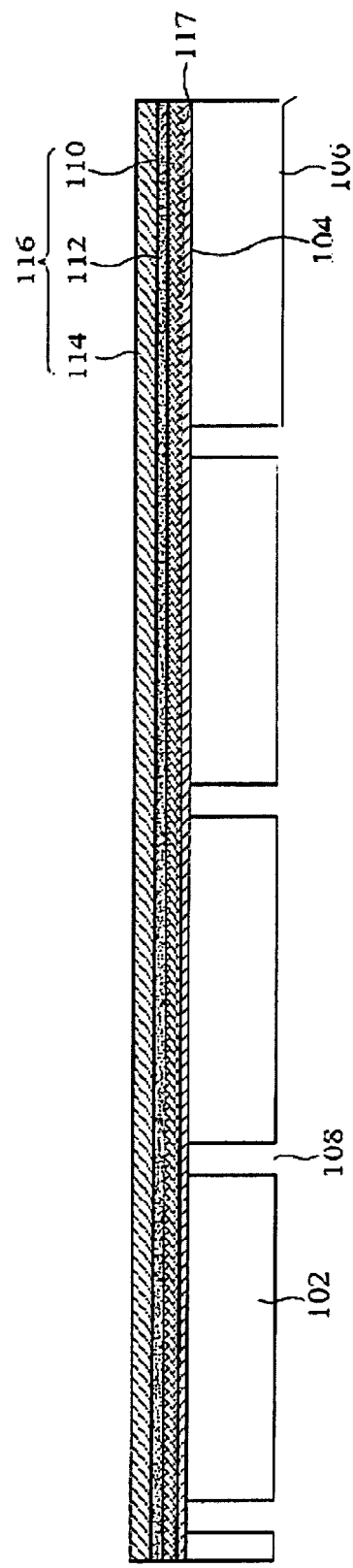
Figure 1D:
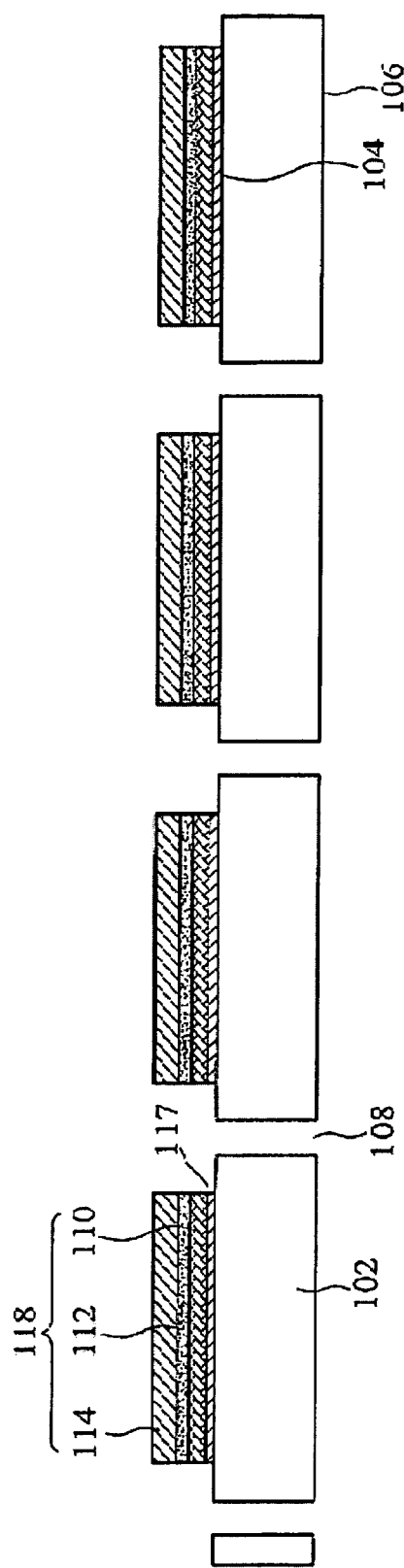
Figure 1E:
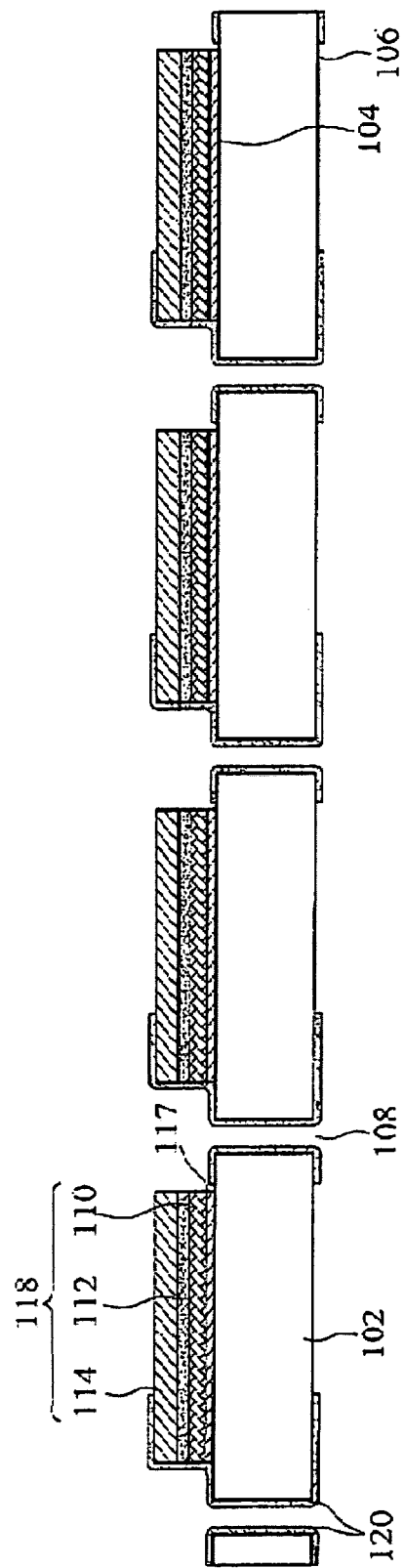

The first embodiment of the present invention is illustrated in FIG. 1A to FIG. 1G. Referring to FIG. 1A, a wafer 102 including a first surface 104 and a second surface 106 is provided. The wafer is silicon wafer in this embodiment, and it is doped with the impurity of phosphorous or boron for increasing the conductivity. The wafer composition is not restricted in the present invention and can be other compositions or materials with good conductivity. Referring to FIG. 1B, a plurality of through-holes are formed in the wafer 102 by laser. Referring to FIG. 1C, a conductive adhesive layer 117 is formed to combine the semiconductor structure 116 with the wafer 102, then the sapphire substrate (not shown) is removed. The semiconductor structure 116 in this embodiment includes at least a buffer layer (not shown), a first conductive type semiconductor layer 114, an active layer 112, and a second conductive type semiconductor layer 110. In this embodiment, the first conductive type semiconductor layer 114 is an n-type GaN series material layer, the active layer 112 is a multi-quantum wells structure of III nitride series materials such as InGaN/GaN stacked, the second conductive type semiconductor layer 110 is a p-GaN series material layer. These semiconductor layers are formed on the sapphire substrate by epitaxial process. Referring to FIG. 1D, the semiconductor structure 116 is defined by the lithography and the etching process to form a plurality of patterned semiconductor structures 118. Referring to FIG. 1E, an isolation layer 120 such as silicon oxide or silicon nitride is formed on the sidewall of the patterned semiconductor structure 118, the first surface 104 and the second surface 106 of the wafer 102, and the through-hole 108. The partial regions of the patterned semiconductor structure 118 and the second surface 106 of the wafer 102 are not covered by the insulation layer 120 for electrical connection in later processes.

Figure 1F:
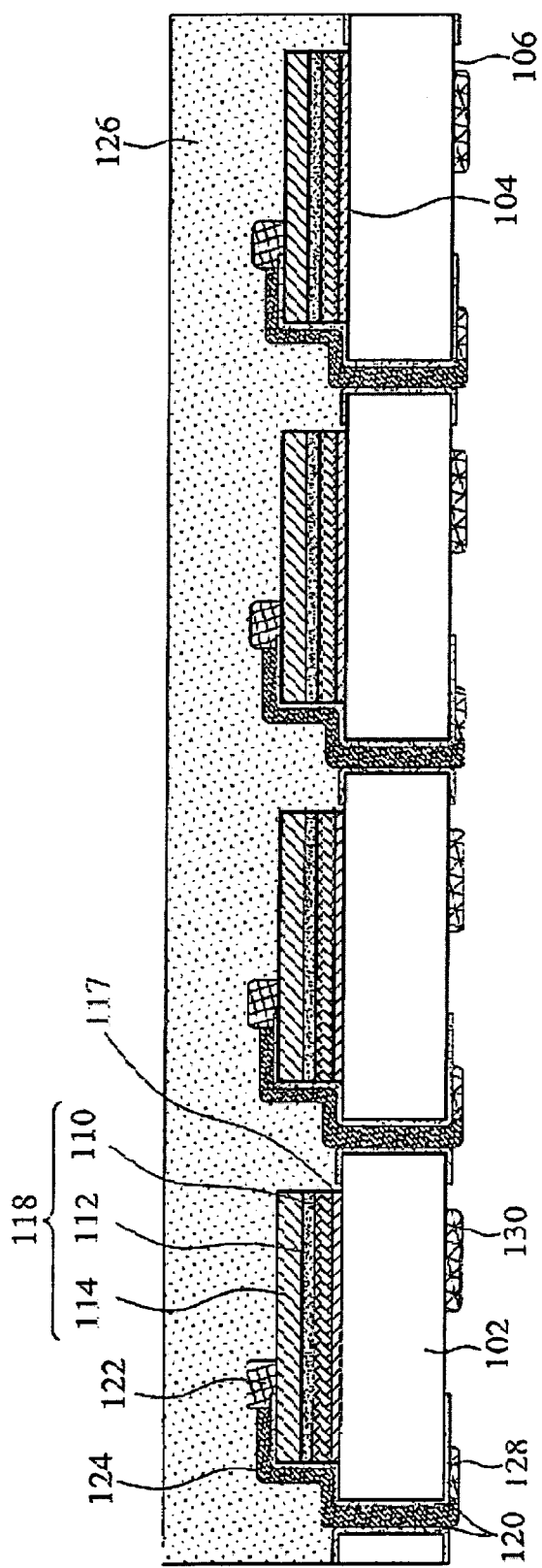

Referring to FIG. 1F, an electrode 122 is formed on the first conductive type semiconductor layer 114 of the patterned semiconductor structure 118 by the electroplating and the thin film coating process, and a first bonding pad 128 and a second bonding pad 130 are formed on the second surface 106 of the wafer 102. Forming a conductive line 124 through the through-hole 108 to connect electrically the electrode 122 with the first bonding pad 128. The insulation layer 120 insulates the electrode 122, the conductive line 124, and the first bonding pad 128 from the wafer 102. Finally, forming a glue layer 126 such as epoxy to cover the patterned semiconductor structure 118, the conductive line 124, and the electrode 122.

Figure 1G:
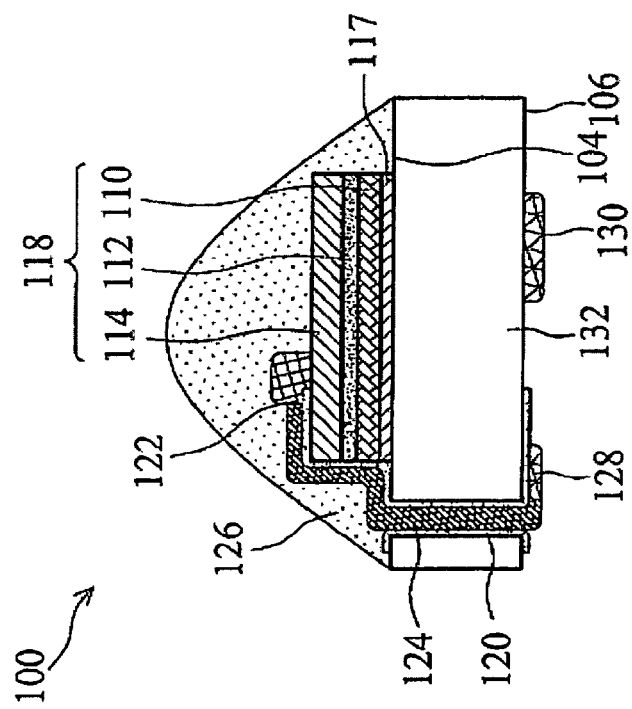
Figure 1H:
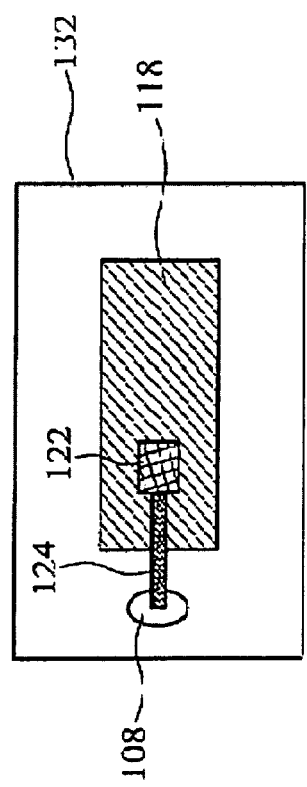

Referring to FIG. 1G, dicing the wafer 102 to form a plurality of substrates 132 for a plurality of surface-mount light-emitting devices. To be succinct, FIG. 1G shows only one surface-mount light-emitting device 100. In this embodiment, the light-emitting device is a vertical type light-emitting device. The first conductive type semiconductor layer 114 of the patterned semiconductor structure 118 connects electrically with the first bonding pad 128 by the electrode 122 and the conductive line 124 which through the through-hole of the substrate 132. The second conductive type semiconductor layer 110 connects electrically with the second bonding pad 130 by the conductive adhesive layer 117 and the conductive substrate 132. FIG. 1H shows the plan view of the FIG. 1G, the area of the patterned semiconductor structure 118 is smaller than that of the substrate 132 in this embodiment, so when the light-emitting device emits the light to the substrate, the light is reflected to the patterned semiconductor structure 118 by the substrate 132 and most of the light is absorbed by the active layer 112. The region of the substrate which is not covered by the patterned semiconductor structure can increase the light extraction efficiency because the reflected light does not pass the active layer 112 and can emit from the substrate 132.

The surface-mount light-emitting device in this embodiment has advantages of a small volume and being suitable for automation manufacturing. It can achieve a reduced package size of the light-emitting device and simpler package process, and satisfy the requirement of being light, thin, short, and small for various electronic products.

FIG. 2A-FIG. 2D describe another embodiment of the invention using the WLCSP technique to achieve the light-emitting device package process. First, referring to FIG. 2A, a wafer 202 including a first surface 201 and a second surface 203 is provided. The wafer is sapphire wafer in this embodiment. The semiconductor structure 210 in this embodiment includes at least a buffer layer (not shown), a first conductive type semiconductor layer 204, an active layer 206, and a second conductive type semiconductor layer 208. In this embodiment, the first conductive type semiconductor layer 204 is an n-type GaN series material layer, the active layer 206 is a multi-quantum wells structure of III nitride series materials such as InGaN/GaN stacked, the second conductive type semiconductor layer 208 is a p-GaN series material layer. These semiconductor layers are formed on the sapphire substrate by epitaxial process.

Figure 2A:
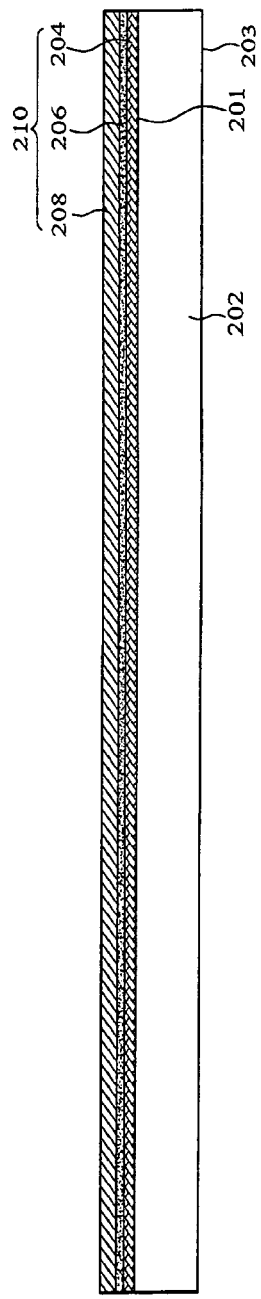
FIGS. 2A-2E illustrate a process flow of forming a light-emitting device in accordance with another embodiment of the present invention.
Figure 2B:
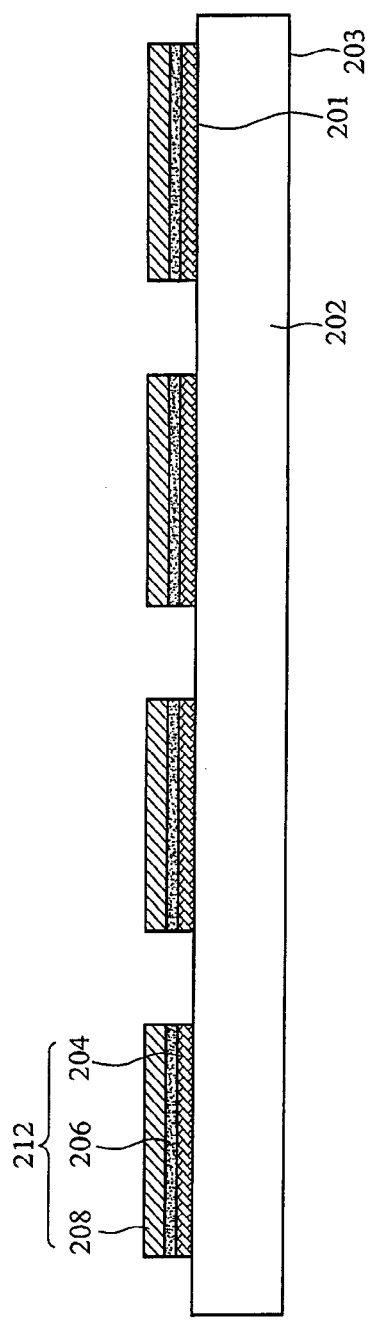
Figure 2C:
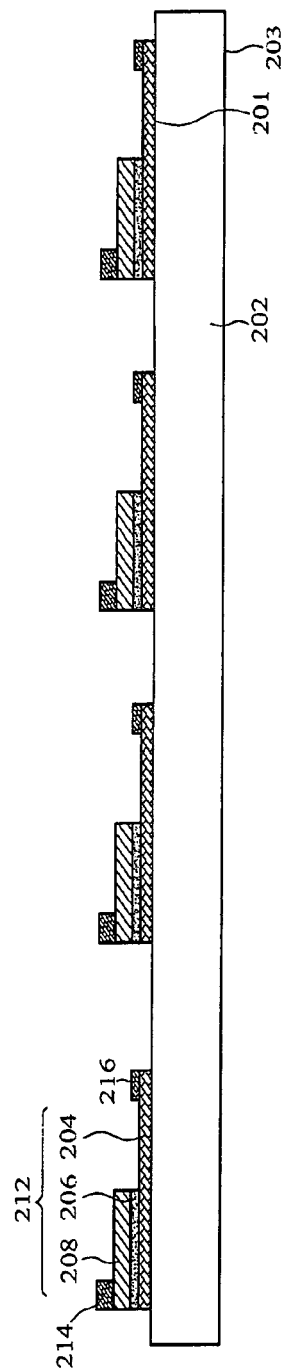

Referring to FIG. 2B, the semiconductor structure 210 is defined by the lithography and the etching process to form a plurality of patterned semiconductor structures 212. Referring to FIG. 2C, the partial region of the semiconductor structure is etched to expose the first conductive type semiconductor layer 204, the second electrode 214 is formed on the second conductive type semiconductor layer 208, and the first electrode 216 is formed on the expose region of the first conductive type semiconductor layer 204.

Figure 2D:
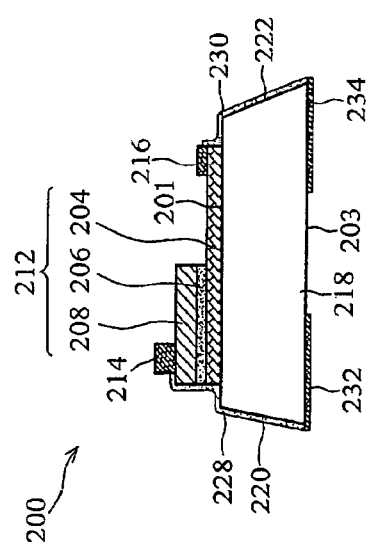
Figure 2E:
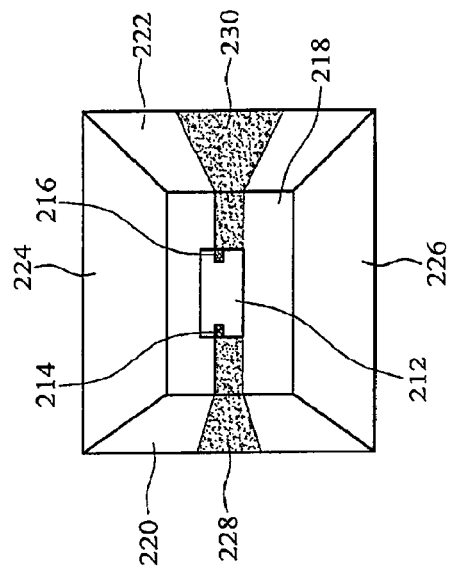

FIG. 2E shows the plan view of FIG. 2D, dicing the wafer 202 to form a plurality of substrates 218 for a plurality of surface-mount light-emitting devices. To be succinct, FIG. 2E shows only one surface-mount light-emitting device 200. The substrate 218 is diced by laser to form a first tilted sidewall 220, a second tilted sidewall 222, a third tilted sidewall 224 and a fourth tilted sidewall 226 for increasing the light extraction efficiency. A preferred range of the angle between the tilted sidewalls 220, 222, 224, 226 and the first surface 201 or the second surface 203 of the substrate 218 is 15-75 degrees in this embodiment. A second bonding pad 232 and a first bonding pad 234 are formed on the second surface 203 of the substrate 218. A second conductive line 228 is formed on the first tilted sidewall 220 and the first surface 201 of the substrate 218. A first conductive line 230 is formed on the second tilted sidewall 222 and the first surface 201 of the substrate 218. A second electrode 214 connects electrically with the second bonding pad 232 through the second conductive line 228. A first electrode 216 connects electrically with the first bonding pad 234 through the first conductive line 230. The light-emitting device is horizontal type in this embodiment with the second electrode 214 and the first electrode 216 located on the same side of the substrate 218.

Referring to FIG. 2E, the area of the patterned semiconductor structure 212 is smaller than the substrate 218 in this embodiment, so when the light-emitting device emits the light to the substrate, the light is reflected to the patterned semiconductor structure by the bonding pad below the substrate and most of the light is absorbed by the active layer 206. The region of the substrate which is not covered by the patterned semiconductor structure 212 can increase the light extraction efficiency because the reflected light does not pass the active layer 206 and can emit from the substrate 218.

Figure 3:
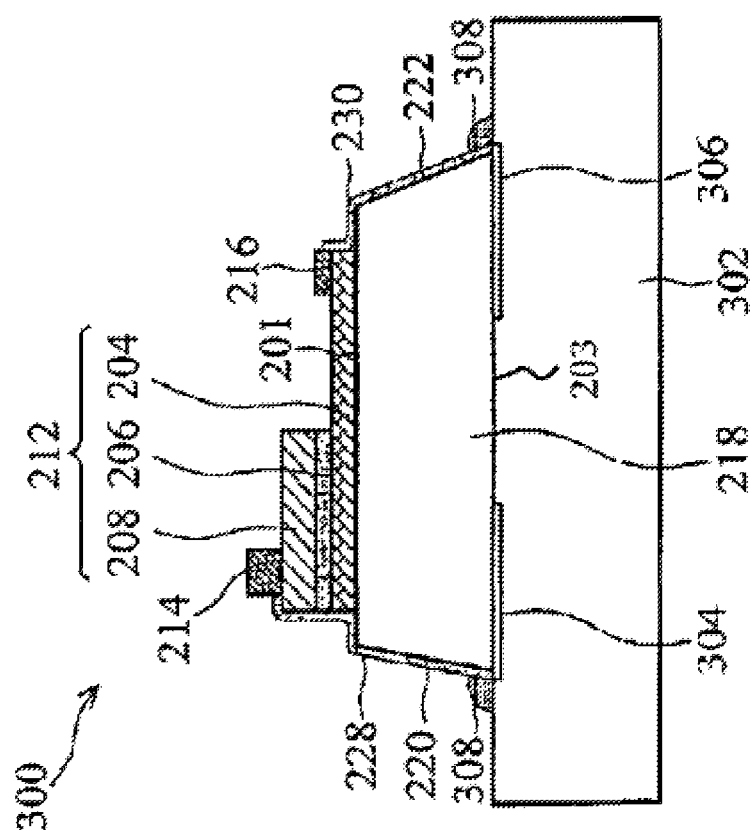
FIG. 3 illustrates a schematic view of forming a surface mounting light-emitting device in accordance with further another embodiment of the present invention.

FIG. 3 illustrates a schematic view of a surface mounting light-emitting device in accordance with further another embodiment of the present invention. The difference between this embodiment and the light-emitting device shown in FIG. 2D is that the first bonding pad and the second bonding pad are omitted in this embodiment. To be convenient, the symbols in this embodiment are the same as the above embodiment. As shown in FIG. 3, a light-emitting device substrate 218 contacts directly with a circuit board 302, the fourth bonding pad 304 and the third bonding pad 306 of the circuit board 302. Because of the tilted sidewall in this embodiment, the solder 308 can climb to the first tilted sidewall 220 and the second tilted sidewall 222, so that the fourth bonding pad 304 and the third bonding pad 306 can connect electrically respectively with the second conductive line 228 and the first conductive line 230 of the surface mount light-emitting device 300 by the solder 308. It can provide strength enough to bond the light-emitting device 300 and the circuit board 302 by using the solder 308 climbing the first tilted sidewall 220 and the second tilted sidewall 222.

The advantages of the above embodiment of the light-emitting device are that it can achieve a reduced package size, and simpler package process by the WLCSP technique. The reduced area of the light epitaxial layer can increase the light extraction efficiency.

Although specific embodiments have been illustrated and described, it will be apparent that various modifications may fall within the scope of the appended claims.

We claim:

1. A light-emitting device, comprising:
   a semiconductor structure;
   conductive lines electrically connected to separate portions of the semiconductor structure; and
   a light-extraction region having:
      tilted sidewalls along which the conductive lines are arranged;
      a first surface connected to the semiconductor structure; and
      a second surface opposite to the first surface and devoid of the conductive lines,
   wherein at least one of the conductive lines is provided directly on at least one of the tilted sidewalls of the light-extraction region.

2. The light-emitting device of claim 1, wherein the titled sidewall is tilted against the first surface or the second surface at an angle between 15 degree and 75 degree.

3. The light-emitting device of claim 1, wherein the titled sidewall is tilted against the first surface or the second surface at an acute angle.

4. The light-emitting device of claim 1, wherein the light-extraction region is wider than the semiconductor structure.

5. The light-emitting device of claim 1, wherein the semiconductor structure is epitaxially formed on the light-extraction region.

6. The light-emitting device of claim 1, further comprising an isolation layer between the semiconductor structure and the conductive line.

7. A light-emitting device, comprising:
- a semiconductor structure able to emit light and having a first width, a first portion and a second portion;
- a first conductive line electrically connected to the first portion and having at least one bend portion;
- a second conductive line electrically connected to the second portion and having a portion that is located at a position that is a shortest distance from the first conductive line, wherein the shortest distance is smaller than the first width; and
- a light-extraction region having:
  - a second width greater than the first width;
  - a first surface overlaid by the first conductive line;
  - a second surface opposite to the first surface and devoid of the first conductive line; and
  - a first sidewall connected to the first surface and the second surface.

8. The light-emitting device of claim 7, wherein the first sidewall is tilted against the first surface or the second surface at an angle between 15 degree and 75 degree.

9. The light-emitting device of claim 7, wherein the first sidewall is tilted against the first surface or the second surface at an acute angle.

10. The light-emitting device of claim 7, wherein the first conductive line is partially arranged along the first sidewall.

11. A light-emitting device comprising:
- a semiconductor structure able to emit light and having a first width, a first portion and a second portion;
- a first conductive line electrically connected to the first portion and having at least one bend portion;
- a second conductive line electrically connected to the second portion, the second conductive line having a portion that is located at a position that is a longest distance from the first conductive line; and
- a light-extraction region having:
  - a second width greater than the first width;
  - a first surface overlaid by the first conductive line;
  - a second surface opposite to the first surface and devoid of the first conductive line; and
  - a first sidewall connected to the first surface and the second surface,
- wherein the longest distance is substantially equal to the second width.

12. A light-emitting device, comprising:
- a semiconductor structure having a first width, a first portion and a second portion;
- a first conductive line electrically connected to the first portion and having a first bend portion;
- a second conductive line electrically connected to the second portion; and
- a light-extraction region having a second width greater than the first width, a first surface near the semiconductor structure and not parallel to the first bend portion, and a second surface far from the semiconductor structure.

13. The light-emitting device of claim 12, wherein the second conductive line has a second bend portion, and wherein the first bend portion is not parallel to the second bend portion.

14. The light-emitting device of claim 12, wherein the second conductive line has a second bend portion, and wherein the first surface is not parallel to the second bend portion.

15. The light-emitting device of claim 12, wherein the second conductive line has a second bend portion, and wherein the first bend portion and the second bend portion have different elevations.

16. The light-emitting device of claim 12, wherein the second conductive line has a portion that is located at a position that is a shortest distance from the first conductive line, and wherein the shortest distance is smaller than the first width.

17. The light-emitting device of claim 12, wherein the second conductive line has a portion that is located at a position that is a longest distance from the first conductive line, and wherein the longest distance is substantially equal to the second width.

18. The light-emitting device of claim 12, wherein the second conductive line has a second bend portion.

* * * * *